United States Patent
Nyman et al.

(10) Patent No.: US 9,012,860 B2
(45) Date of Patent: Apr. 21, 2015

(54) DUAL-SPAD-BASED SINGLE-PHOTON RECEIVER

(71) Applicant: Princeton Lightwave, Inc., Cranbury, NJ (US)

(72) Inventors: Bruce Mitchell Nyman, Freehold, NJ (US); Mark Allen Itzler, Princeton, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 85 days.

(21) Appl. No.: 13/891,513

(22) Filed: May 10, 2013

(65) Prior Publication Data

US 2013/0334434 A1    Dec. 19, 2013

Related U.S. Application Data

(60) Provisional application No. 61/647,075, filed on May 15, 2012.

(51) Int. Cl.
    *H01L 31/107* (2006.01)
    *G01J 1/44* (2006.01)
    *H01L 31/02* (2006.01)

(52) U.S. Cl.
    CPC .............. *H01L 31/107* (2013.01); *G01J 1/44* (2013.01); *H01L 31/02027* (2013.01); *G01J 2001/442* (2013.01)

(58) Field of Classification Search
    CPC .............................. G01J 1/44; H01L 31/107
    USPC ............................ 250/371, 214.1; 257/432
    See application file for complete search history.

(56) References Cited

U.S. PATENT DOCUMENTS

| | | | |
|---|---|---|---|
| 6,218,657 B1 | 4/2001 | Bethune et al. | |
| 2001/0020863 A1* | 9/2001 | Cova et al. | 327/514 |
| 2006/0192086 A1* | 8/2006 | Niclass et al. | 250/214.1 |
| 2008/0055355 A1* | 3/2008 | Hersch et al. | 347/19 |
| 2010/0148040 A1* | 6/2010 | Sanfilippo et al. | 250/214.1 |
| 2010/0290626 A1* | 11/2010 | Jenkins et al. | 380/278 |
| 2013/0072768 A1* | 3/2013 | Crane et al. | 600/316 |

OTHER PUBLICATIONS

Namekata et al., "800 MHz Single-photon detection at 1550-nm using an InGaAs/InP avalanche photodiode operated with a sine wave gating", "Optics Express", Oct. 16, 2006, vol. 14, No. 21, Publisher: Optical Society of America.

Tomita, et al., "Balanced, gated-mode photon detector for quantum-bit discrimination at 1550 nm", "Optics Letters", Oct. 15, 2002, pp. 1827-1829, vol. 27, No. 20, Publisher: 2002 Optical Society of America, Published in: US.

(Continued)

*Primary Examiner* — David Porta
*Assistant Examiner* — Abra Fein
(74) *Attorney, Agent, or Firm* — Kaplan Breyer Schwarz & Ottesen, LLP

(57) ABSTRACT

A single-photon receiver is presented. The receiver comprises two SPADs that are monolithically integrated on the same semiconductor chip. Each SPAD is biased with a substantially identical gating signal. The output signals of the SPADs are combined such that capacitive transients present on each output signal cancel to substantially remove them from the output signal from the receiver.

21 Claims, 7 Drawing Sheets

(56) References Cited

OTHER PUBLICATIONS

Campbell, et al., "Common-Mode Cancellation in Sinusoidal Gating With Balanced InGaAs/InP Single Photon Avalanche Diodes", Dec. 2012, pp. 1505-1511, vol. 48, No. 12, Publisher: IEEE Journal of Quantum Electronics, Published in: US.

Yuan, et al., "High speed single photon detection in the near infrared", "Applied Physics Letters 91", Jul. 27, 2007, Publisher: Appl. Phys. Lett. 91, 041114 (2007), Published in: UK.

* cited by examiner

DUAL-SPAD-BASED SINGLE-PHOTON RECEIVER

CROSS REFERENCE TO RELATED APPLICATIONS

This case claims priority of U.S. Provisional Patent Application U.S. 61/647,075, which was filed on May 15, 2012, and which is incorporated herein by reference.

FIELD OF THE INVENTION

The present invention relates to single-photon detection in general, and, more particularly, to single-photon receiver circuitry.

BACKGROUND OF THE INVENTION

Photodetectors capable of detecting a single photon (i.e., a single "particle" of optical energy) have enabled systems directed toward applications such as single-photon detection and low-light-level imaging. Due to its performance, reliability, cost, and ease of deployment, the semiconductor-based single-photon avalanche diode (SPAD) has been the basis for most of these systems. In recent years, single-photon infrared applications have become of particular interest. As a result, SPADs formed in the indium-gallium-arsenide/indium-phosphide material systems have been a focus of much research and development. Although there has been significant improvement in this device technology over the past several years, single photon receivers have generally been limited to operational rates (i.e., counting rates) below 10 MHz. More recently, however, there has been increased interest in defense applications that require counting rates in the GHz range, such as ultra-secure quantum cryptography systems, quantum information processing, quantum computing, and long distance free-space optical communications. Unfortunately, this combination of high operation rate and wavelength range has historically been difficult, if not impossible, to achieve.

An avalanche photodiode derives its name from the manner in which its output signal is created. When photons are absorbed by an avalanche photodiode, their energy frees bound charge carriers (electrons and holes) that then become free-carrier pairs. In the presence of an electric field (due to a bias voltage applied to the photodiode), these free-carriers are accelerated through a region of the avalanche photodiode referred to as the "multiplication region." As the free carriers travel through the multiplication region, they collide with other carriers bound in the atomic lattice of the semiconductor, thereby generating more free carriers through a process called "impact ionization." These new free-carriers also become accelerated by the applied electric field and generate yet more free-carriers. This avalanche event can occur very rapidly and efficiently and it is possible to generate several hundred million free-carriers from a single absorbed photon in less than one nanosecond.

In order to enable detection of a single photon, a SPAD is biased with a reverse bias voltage having a magnitude greater than the magnitude of its "breakdown voltage," which is the bias level above which free-carrier generation can become self-sustaining and result in run-away avalanche. This is referred to as "arming" the device. When the SPAD is armed, a single free carrier pair created by the absorption of a single photon can create a runaway avalanche resulting in an easily detectable macroscopic current.

Once a photon has been detected, the self-sustained avalanche must be stopped before the arrival of another photon can be detected. Referred to as "quenching," the avalanche is stopped by reducing the magnitude of the applied reverse bias voltage below the magnitude of the breakdown voltage.

In typical operation, a periodic bias signal (referred to as a "gating signal") is applied to a SPAD to arm and quench the device during each bit period. The maximum frequency at which a SPAD can be gated is primarily determined by how fast an avalanche event can be stopped once it is detected and how fast the SPAD can be re-armed once the avalanche event has been quenched.

Unfortunately, the frequency of the gating signal is limited by the fact that not all free carriers are instantaneously swept out of the avalanche region once the device is quenched. With each avalanche event, some fraction of the electrical carriers created will become trapped at defects (e.g., crystalline defects, impurities, etc.) in the multiplication region. These trapped carriers become released in a temporally random manner as a function of temperature, the type of trap state, and applied bias voltage. As a result, the trapped carrier population decays exponentially with time.

Detrapping can occur without consequence while the SPAD remains in its quenched state. If a trapped carrier is released after the SPAD has been re-armed, however, it is likely to trigger an avalanche event that is indistinguishable from one caused by absorption of a photon. Avalanche events induced by carriers created by any mechanism other than photo-excitation (i.e., in the absence of input photons) are referred to as "dark counts," and dark counts caused by the detrapping of trapped carriers in the multiplication region are referred to as "afterpulses." The probability of an afterpulse decays exponentially with the hold-off time between quenching a SPAD and re-arming it, so decreasing the hold-off time leads to a higher probability of afterpulsing.

Afterpulsing represents one of the primary roadblocks to high-rate photon counting. Prior-art methods for reducing afterpulsing have been focused on limiting the charge flow induced by an avalanche event, thereby limiting the number of carriers that can potentially become trapped. One such method relies on the use of a negative-feedback element monolithically integrated with the SPAD to form a negative-feedback avalanche diode (NFAD), such as is described in U.S. Pat. No. 7,719,029 entitled "Negative Feedback Avalanche Photodiode," issued May 18, 2010, and which is incorporated herein by reference. Unfortunately, limiting the charge flow alone leads to additional complications since it results in smaller amplitude signals to be detected. These small signals can be masked by the large transient signals that are generated by the interaction of high-frequency gating signal components with reactance inherent in the SPAD structure. As a result, approaches for high-frequency transient cancellation have been developed in an effort to enable accurate detection of small-amplitude avalanche pulses.

Ideally, a gating signal maximizes the portion of each bit period during which a SPAD is armed, while providing a hold-off time just sufficient to minimize afterpulsing. Further, it is highly desirable to provide gating signals that have fast transitions (i.e., sub-nanosecond) between their low state (quenching bias) and high state (arming bias). Unfortunately, these fast transitions represent high frequency components in the gating signal that serve to generate large capacitive transients in the SPAD. These transients can couple into the SPAD output signal thereby reducing its signal-to-noise ratio. As a result, methods for suppressing these capacitive transients to enable more accurate detection of the typically much smaller signals induced by SPAD avalanche events have been developed. These methods fall into one of two general approaches, after-the-fact cancellation of generated capacitive transients or avoidance of the generation of the capacitive transients in the first place.

One of the more promising methods for avoiding generation of capacitive transients relies on the use of a gating signal devoid of high frequency components—in particular, a sinusoidal gating signal. An example of such a method is described in U.S. Pat. No. 7,705,284, issued Apr. 27, 2010, which is incorporated herein by reference. In this method, a gating signal comprising a D.C. voltage and a substantially pure sinusoidal gating signal is applied to a SPAD. Because the sinusoidal gating signal contains essentially only one frequency component, gating signal components in the SPAD output signal are concentrated at this frequency component and its harmonics. The signal components that arise from the reception of single photons in the SPAD output signal are akin to an impulse response, however. As a result, these photon signal components include frequencies that are widely spread across the frequency spectrum. Relatively straightforward electrical filters can be applied to the SPAD output signal, therefore, to remove the gating signal components and facilitate detection of avalanche events due to reception of a single photons—even when the avalanche amplitude is small. Sinusoidal-gating methods have demonstrated afterpulsing as low as 3.4% with a photon-detection efficiency of approximately 10.5% for SPADs biased with gate signals having a frequency of 2 GHz.

Unfortunately, while the sinusoidal-gating concept simplifies elimination of the gating-signal components, the use of the "top" portion of the sine wave as the SPAD gating bias means that the excess bias changes dramatically throughout a significant fraction of the gate duration. This is due to the fairly shallow slope of the rise and fall of the gate imposed by the simple sine-wave functional form. As a result of the changing excess bias, the photon detection efficiency changes as well. If photon arrivals can be aligned to the relatively "flat" portion of the gate with very low jitter, then the shallow rise and fall times will not be a serious issue. However, for GHz-rate gating with effective gate widths on the order of just 100-200 picosecond (ps), jitter in the photon arrival time of just 50-100 ps can significantly impact the effective photon detection efficiency from one count to the next. As applications demand higher operating frequency, this problem will be exacerbated.

The use of a "squarer" gate signal having more rapid rise and fall times provides a relatively wider portion of bit period in which the bias is "flat." As a result, the photon detection efficiency is relatively constant. Further, a more sharply falling edge of a gating signal provides more rapid avalanche quenching than a smooth sine wave. This results in less charge flow per avalanche, and consequently to a reduction in afterpulsing relative to sinusoidal gating.

As opposed to sinusoidal-gating methods, therefore, some prior-art gating methods derive some of the advantages of faster rise and fall time gate signals by employing square-wave gating signals and addressing the inevitable capacitive transients by canceling them out with additional circuitry. To date, some of the most promising results for transient cancellation have been obtained by employing a "self-differencing" circuit, as described by Yuan, et al., in "Multi-gigahertz operation of photon counting InGaAs avalanche photodiodes," *Applied Physics Letters, Vol.* 96, 071101 (2010), and "High-speed single photon detection in the near infrared," *Applied Physics Letters, Vol.* 91, 041114 (2007), each of which is incorporated herein by reference. In such methods, a square-wave gating signal is applied to a SPAD and the output signal of the SPAD is provided to a 50:50 splitter. The splitter splits the SPAD output signal into two signals, one of which is delayed by exactly one bit period of the gating signal. The delayed signal of a first bit period is then subtracted from the non-delayed signal from the next bit period. As a result, identical capacitive transients produced during sequential gate periods are canceled, leaving only any net avalanche signal that might occur. Self-differencing circuit methods have demonstrated afterpulsing as low as 1.4% with a photon-detection efficiency of approximately 11.8% for SPADs biased with gate signals having a frequency of 2 GHz.

An alternative approach to transient cancellation, after-the-fact, is based upon the use of a matched SPAD pair. The output from each SPAD is provided to a circuit element that provides an output signal based only on the difference between the two SPAD outputs, thereby by substantially rejecting capacitive transients included in both signals. An example of such an approach is described in "Balanced, gated-mode photon detector for quantum-bit discrimination at 1550 nm," *Optics Letters, Vol.* 27, pp. 1827-1829 (2002).

Unfortunately, prior-art SPAD-gating methods have significant drawbacks that have limited their utility in practical single-photon detection systems. These drawbacks include: a need to operation at only a single fixed frequency, which limits their utility in communications applications, among other systems; high residual afterpulsing levels, which limits their signal-to-noise ratio and operating rates; complicated optical packaging; and relatively large form factors, which preclude easy deployment and commercialization.

SUMMARY OF THE INVENTION

The present invention enables single-photon detection at GHz rates and above without some of the drawbacks and limitations of the prior art. Embodiments of the present invention are particularly well suited for use in applications such as quantum cryptography, quantum information processing, quantum computing, and long-distance free-space optical communications.

An illustrative embodiment of the present invention is a single-photon receiver that includes a first SPAD and second SPAD. The SPADs are monolithically integrated on the same substrate and only the first SPAD is configured to detect the arrival of a photon. The SPADs are configured in an anode-to-anode arrangement and provided with the same gating signal, which is a substantially square-wave signal. As a result, the gating signal includes frequency components that are higher than its fundamental frequency. In response to the gating signal, the first SPAD provides a first signal and the second SPAD generates a second signal, wherein each of the first signal and second signal includes capacitive transients that arise from the high-frequency components. Since the SPADs are gated with the same gating signal, however, these capacitive transients are substantially identical. The first and second signals are combined into an output signal whose magnitude is based on the difference in the first and second signals. As a result, capacitive transients are substantially canceled and the output signal contains only signals due to avalanche events that arise from receipt of photons at the first SPAD.

In some embodiments, the first signal is inverted at an inverter and added to the second signal to generate the output signal. In some embodiments, the second signal is inverted at an inverter and added to the first signal to generate the output signal.

In some embodiments, the two SPADs are configured in an anode-to-cathode arrangement.

In some embodiments, the effective gating of one of two SPADs is inverted with respect to the other SPAD and the outputs of the two SPADs are directly summed to result in the cancellation of transients in their outputs.

In some embodiments, one of the two SPADs is biased above its breakdown voltage while the other SPAD is biased below its breakdown voltage.

An embodiment of the present invention is a single-photon receiver comprising: a first SPAD that is operative for providing a first output signal; a second SPAD that is operative for providing a second output signal, the first SPAD and second SPAD being monolithically integrated; a splitter that is dimensioned and arranged to provide a first gating signal to each of the first SPAD and second SPAD; and an output terminal, the output terminal being operative for providing a third output signal that is based on the first output signal and the second output signal.

DETAILED DESCRIPTION

The following terms are defined for use in this Specification, including the appended claims:

A single-photon avalanche diode is defined as an avalanche photodiode that is dimensioned and arranged to enable the generation of a detectable macroscopic current signal upon receipt of a single photon when biased with a bias voltage that exceeds its breakdown voltage. A single-photon avalanche diode has a layer structure and explicit device design features that enable it to exhibit lower dark counts and less afterpulsing than a conventional avalanche photodiode.

A gating signal is defined as a periodic signal applied to a SPAD to temporarily bring the magnitude of its reverse bias voltage above the magnitude of its breakdown voltage. As a result, a gating signal alternately arms and quenches the SPAD at a rate that depends on the frequency of the gating signal.

Monolithically integrated is defined as formed on the same substrate. Monolithically integrated, as defined, does not mean attached to the same substrate via a hybrid bonding operation or conventional packaging operation. An example of monolithically integrated devices includes two avalanche diodes that are formed on the same substrate via the same fabrication operations. In some cases, one or more fabrication operation is performed on one of the avalanche diodes but not on the other, or visa-versa. For example, a light-blocking layer might be formed as part of one avalanche diode but not be formed as part of the other.

Electrically connected is defined as being in direct physical and electrical contact without any intervening elements (neglecting an electrically conductive intermediate, such as a wire or metal trace that connects devices, etc.).

Electrically coupled is defined as a configuration in which two objects are in electrical communication. This can be via direct physical contact (e.g., a plug in an electrical outlet, etc.), via an electrically conductive intermediate (e.g., a wire that connects devices, etc.), or via one or more intermediate devices (e.g., a resistor electrically connected between two other electrical devices, etc.).

Figure 1:
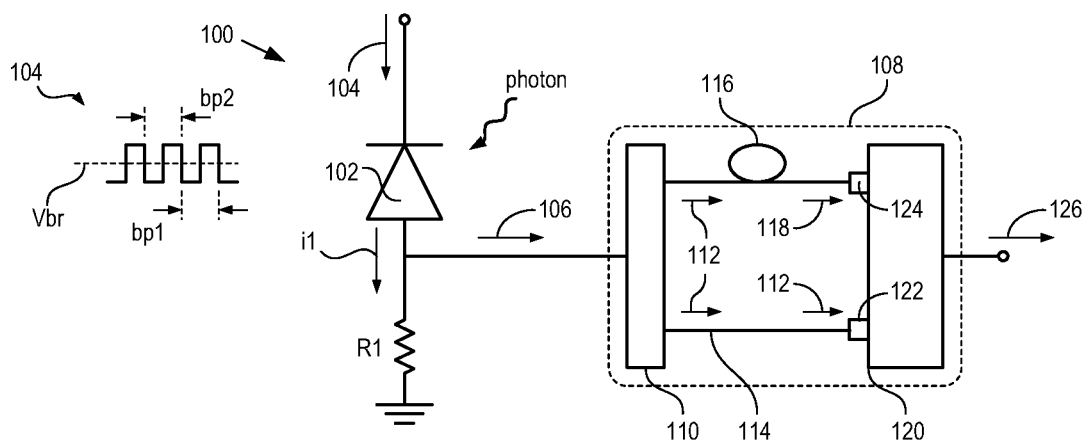
FIG. 1 depicts a schematic drawing of a single-photon receiver comprising a self-differencing circuit for canceling capacitive transients in accordance with the prior art.

FIG. 1 depicts a schematic drawing of a single-photon receiver comprising a self-differencing circuit for canceling capacitive transients in accordance with the prior art. Receiver 100 comprises SPAD 102, resistor R1, and self-differencing circuit 108.

SPAD 102 is an avalanche photodiode adapted for single-photon detection. SPAD 102 is biased with gating signal 104, which alternately arms and quenches SPAD 102 during each bit period.

Figure 2:
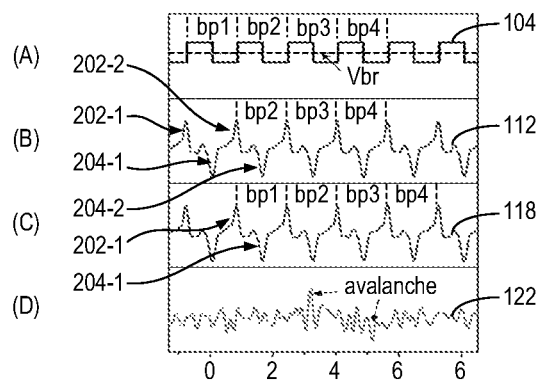
FIG. 2A depicts gating signal 104 of receiver 100 versus time.
FIG. 2B depicts first signal 112 of receiver 100 versus time, in the absence of a received photon at SPAD 102.
FIG. 2C depicts second signal 118 of receiver 100 versus time, in the absence of a received photon at SPAD 102.
FIG. 2D depicts output signal 126 versus time in response to receipt of a photon.

FIG. 2A depicts gating signal 104 of receiver 100 versus time. Gating signal 104 is a square-wave voltage signal having a fundamental frequency of 1 GHz. Typically, gating signal 104 includes a D.C. voltage level that is slightly below the breakdown voltage, Vbr, of SPAD 102. Within each bit period, bp, the magnitude of gating signal 104 exceeds Vbr for the first half of bit period by and is below Vbr for the second half of bit period bp. As a result, SPAD 102 is armed for the first half of each bit period and is quenched for the second half of each bit period. SPAD 102 provides current signal i1, which gives rise to voltage signal 106 across resistor R1. Voltage 106 is provided to the input of self-differencing circuit 108.

Self-differencing circuit 108 includes 50:50 splitter 110, transmission line 114, delay line 116, and differencer 120.

Splitter 110 evenly splits voltage signal 106 into substantially identical first signals 112, which are carried on transmission line 114 and delay line 116. Transmission line 114 conveys first signal 112 to port 122 of differencer 120 without imparting any significant time delay on the signal. Delay line 116, however, delays first signal 112 by exactly one bit period to produce second signal 118. Second signal 118 is then provided to input port 124 of differencer 120. In some prior-art self-differencing circuits, delay line 116 includes an adjustable delay element, such as a coaxial line stretcher, that enables a slightly tunable delay so that small errors in the fundamental frequency of gating signal 104 can be accommodated. The amount of delay provided for this purpose is very small, however, since the variation in gating signal frequency is typically only over a range of a few tens of MHz (e.g., from 0.987 GHz to 1.033 GHz).

Differencer 120 receives first signal 112 and second signal 118 at input ports 122 and 124, respectively, and provides output signal 126 based on the difference of these two signals.

FIGS. 2B and 2C depict first signal 112 and second signal 118 of receiver 100, respectively, versus time, in the absence of a received photon at SPAD 102. In the absence of a received photon, voltage signal 106 should be a D.C. voltage level of approximately zero volts; however, the fast rise and fall times of gating signal 104 represent higher frequency components that induce capacitive transients on the signal. Specifically, each rising edge of gating signal 104 induces a positive transient 202 in each bit period (e.g., positive transients 202-1 and 202-2 in bit periods bp1 and bp2, respectively) and a negative transient 204 in each bit period (e.g., negative transients 204-1 and 204-2 in bit periods bp1 and bp2, respectively).

Since each bit period of gating signal 104 is virtually identical, the gating-signal induced content of voltage signal 106 is also identical in each bit period. As a result, bit-period bp1 of delayed second signal 118 is substantially identical to bit-period bp2 of non-delayed first signal 112. Transients 202-1 and 204-1 in second signal 118, therefore, are identical to positive transients 202-2 and 204-2 in first signal 112. As a result, in the absence of a received photon, differencer 120 provides output voltage 122 as a substantially net zero voltage (in the ideal case).

When a photon is received by SPAD 102, however, it induces an avalanche event that results in a substantial voltage spike on voltage signal 106. FIG. 2D depicts output signal 126 versus time in response to receipt of a photon. Output signal 126 shows the effect of the receipt of a photon by SPAD 102 during bit period bp3. Since differencer 120 subtracts bit period bp2 of second signal 118 from bit period bp3 of first signal 112, the avalanche event due to the receipt of the photon can be easily detected. It should be noted that output signal 126 includes a negative voltage spike in bit period bp4 due to the one bit period propagation delay of the avalanche event in second signal 118.

Unfortunately, self-differencing circuits are limited in a number of ways. First, they are inherently restricted to a single operating frequency, although slight variation of operating frequency for compensation of gating frequency variation has been reported. Second, the cost and complexity of the splitter, delay element, and differencer add significant expense and foot print to a self-differencing receiver, making a commercially viable, easily deployed module impractical in many applications.

Figure 3:
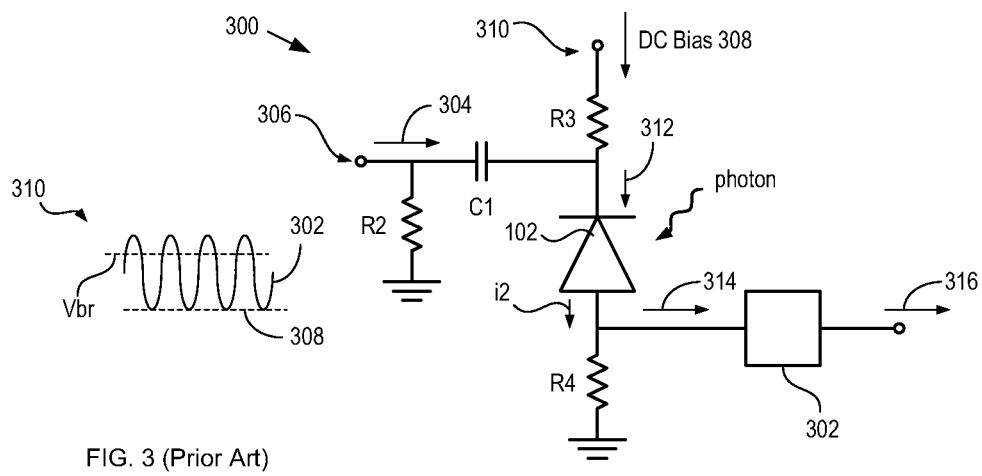
FIG. 3 depicts a schematic drawing of a single-photon receiver that is operable with sinusoidal gating in accordance with the prior art.

FIG. 3 depicts a schematic drawing of a single-photon receiver that is operable with sinusoidal gating in accordance with the prior art. Receiver 300 employs a sinusoidal gating signal so as to avoid generation of capacitive transients. Receiver 300 comprises SPAD 102, resistors R2, R3, and R4, coupling capacitor C1, and band-rejection filter 302. SPAD 102 is biased with bias signal 312, which is a combination of gating signal 304, provided at node 306, and DC bias voltage 308, provided at node 310.

Figure 4:
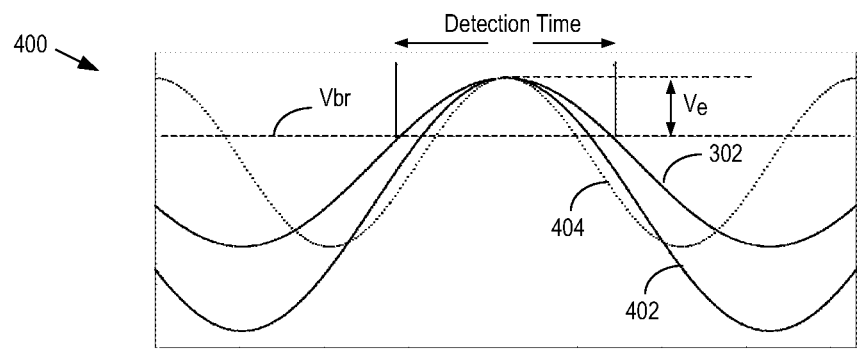
FIG. 4 depicts examples of sinusoidal gating signals suitable for use with receiver 300.

FIG. 4 depicts examples of sinusoidal gating signals suitable for use with receiver 300. Gating signal 404 is a sinusoidal voltage signal having a fundamental frequency of approximately 250 MHz. Within each bit period, the amount of time SPAD 102 can detect a photon (i.e., its detection time) is based on the amplitude and frequency of gating signal 304. Specifically, while the magnitude of gating signal 304 exceeds the magnitude of breakdown voltage Vbr, SPAD 102 is armed. For the remainder of each bit period, SPAD 102 is in a quenched state and unable to detect the arrival of a photon.

SPAD 102 provides current signal i2, which develops voltage signal 314 across resistor R4. Voltage signal 314 is provided to the input of band-rejection filter 302.

Band-rejection filter 302 is a filter comprising a plurality of notch filters that are located at the fundamental frequency of gating signal 304 and one or more of its harmonics. As a result, band-rejection filter 302 provides output signal 316 by removing only the gating signal components in voltage signal 314, while enabling the spectral content associated with a received photon to pass through the filter. As discussed in U.S. Pat. No. 7,705,284, the operation of receiver 300 depends on the fact that gating signal 304 is a substantially pure sine wave, which results in the gating signal components in voltage signal 314 being sine waves as well. The operation of receiver 300 further relies on the fact that the optical detection signal that results from receipt of a photon is an impulse; therefore, its various frequency components are spread widely in the frequency spectrum. As a result, the impulse signal associated with the receipt of a photon by SPAD 102 passes through band-rejection filter 302 with only slight loss, while the filter suppresses the sinusoidal component of the gating signal in voltage signal 314 to produce output signal 316.

Unfortunately, like the self-differencing approach described above, sinusoidal gating methods are limited in several important ways. First, the detection time within each bit period is determined by the amount of each wavelength of gating signal 304 that exceeds breakdown voltage Vbr. The magnitude of this excess voltage, Ve, determines the photon detection efficiency of the receiver. Ideally, the photon detection efficiency is relatively stable; however, since the magnitude of sinusoidal gating signal 304 is constantly changing, so too does the photon detection efficiency of receiver 300.

Relatively constant photon detection efficiency can be obtained, however, by limiting the detection time (i.e., gate width) to only that portion of gating signal 304 having a relatively "flat" portion. For applications requiring high frequency operation (i.e., GHz and above), however, this would result in an effective gate width of only 100-200 picoseconds. As a result, timing jitter (commonly 50-100 ps) can affect effective photon detection efficiency from one count to the next. Further, as the frequency of gating signal 304 increases, the length of the detection time is further reduced—exacerbating the timing jitter issue. Still further, by limiting the gate width to only the relatively flat peak portion of gating signal 304, the duty factor of receiver 300 (the percentage of each bit period during which the SPAD 102 is armed) is significantly reduced.

Second, because band-rejection filter 302 has a fixed frequency response, receiver 300 is not frequency-agile. As a result, its utility in many communications applications is limited.

Figure 5:
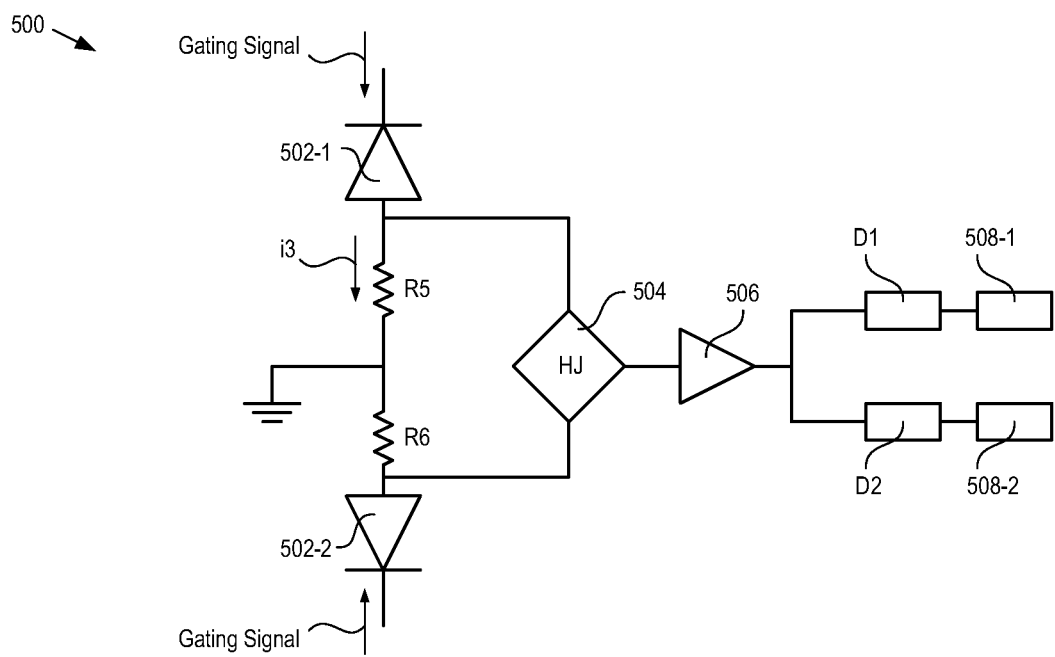
FIG. 5 depicts a schematic drawing of a single-photon receiver that employs a SPAD pair for canceling capacitive transients in accordance with the prior art.

FIG. 5 depicts a schematic drawing of a single-photon receiver that employs a SPAD pair for canceling capacitive transients in accordance with the prior art. Receiver 500 comprises SPADs 502-1 and 502-2, resistors R5 and R6, hybrid junction 504, amplifier 506, descriminators D1 and D2, and counters 508-1 and 508-2. Receiver 500 cancels capacitive transients by taking the balanced output of SPADS 502-1 and 502-2.

Each of SPADs 502-1 and 502-2 is analogous to SPAD 102. SPADs 502-1 and 502-2 are discrete avalanche photodiodes, which are selected such that their operating characteristics are almost the same.

SPADs 502-1 and 502-2 are arranged in a circuit with conventional resistors R5 and R6 such that their output signals are received at hybrid junction 504. Hybrid junction 504 is a conventional 180° hybrid junction that subtracts the signals and provides the difference to amplifier 506.

Amplifier 506 amplifies the difference signal and passes it to each of descriminators D1 and D2 and their respective counters 508-1 and 508-2.

Since each of SPADs 502-1 and 502-2 receives the same gating signal, each of their output signals includes substantially the same capacitive transients. When their output signals are subtracted at hybrid junction 504, therefore, these transient signals are suppressed. In addition, since SPAD 502-1 provides negative signal pulses at its output while SPAD 502-2 provides positive signal pulses, the identity of which SPAD provided a signal pulse can be readily determined from the sign of the output of hybrid junction 504.

Receiver 500 is not without drawbacks of its own, however. Specifically, proper operation relies upon the absence of a dark count or afterpulse in the SPAD not detecting a photon. In addition, two optical fibers are required resulting in a more complex optical packaging arrangement. Further, in order to achieve sufficient sensitivity, the operating characteristics of SPADs 502-1 and 502-2 must be nearly identical.

Figure 6:
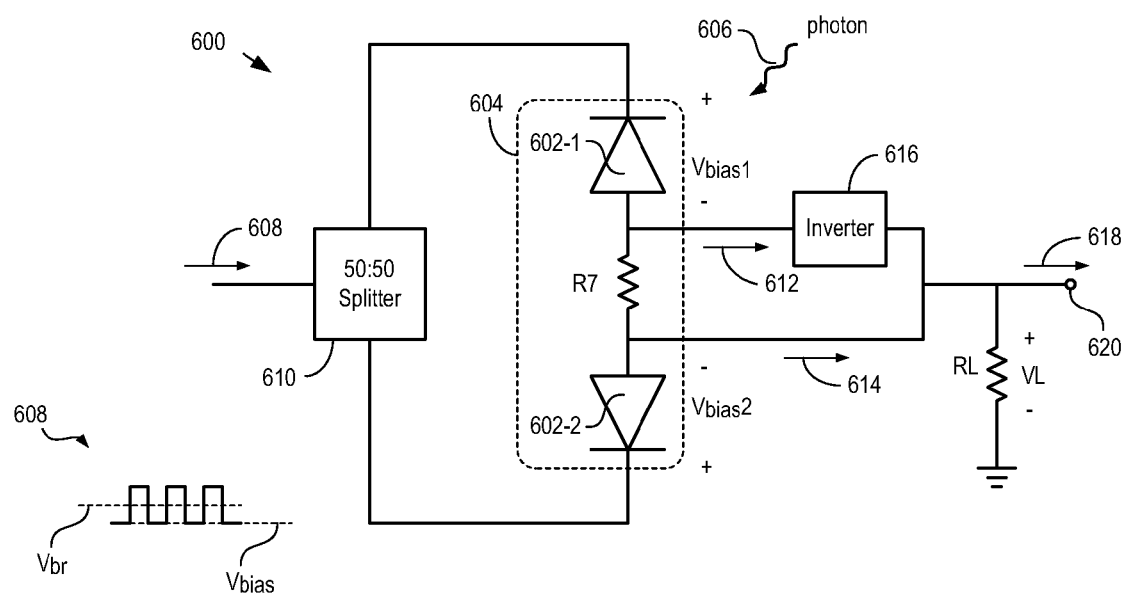
FIG. 6 depicts a schematic drawing of a single-photon receiver in accordance with an illustrative embodiment of the present invention.

FIG. 6 depicts a schematic drawing of a single-photon receiver in accordance with an illustrative embodiment of the present invention. Receiver 600 comprises SPADs 602-1 and 602-2, resistor R7, splitter 610, and inverter 614.

Figure 7:
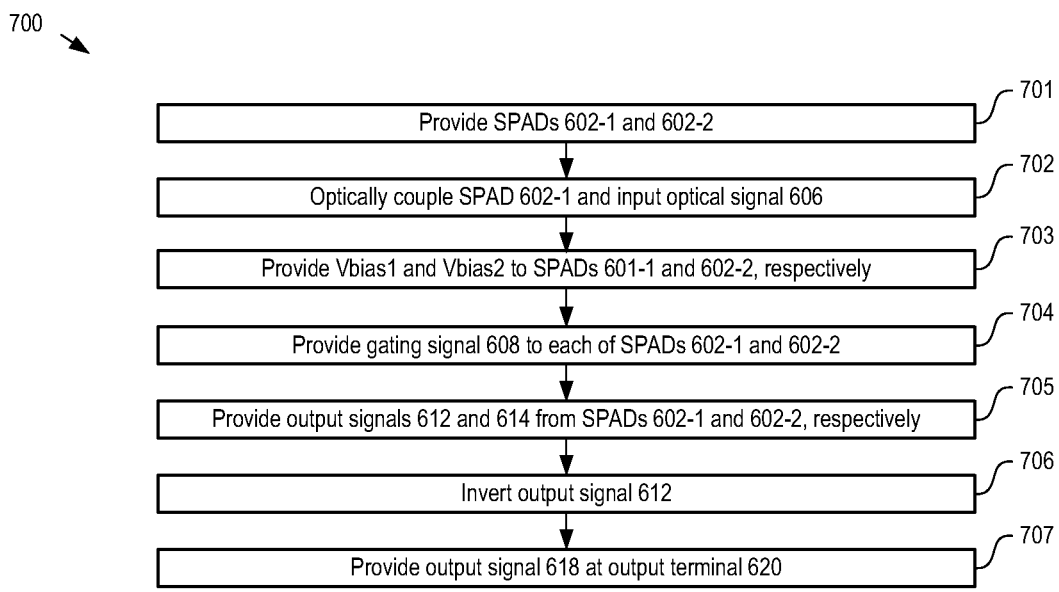
FIG. 7 depicts operations of a method suitable for operation of a single-photon receiver in accordance with the illustrative embodiment of the present invention.

FIG. 7 depicts operations of a method suitable for operation of a single-photon receiver in accordance with the illustrative embodiment of the present invention. Method 700 begins with operation 701, wherein SPADS 602-1 and 602-2 are provided as part of packaged chip 604. Typically, chip 604 is included in a conventional package that also includes resistor R7, and a thermoelectric cooler.

Each of SPADs 602-1 and 602-2 is analogous to SPAD 102, described above and with respect to FIG. 1; however, SPADs 602-1 and 602-2 are monolithically integrated on the same semiconductor substrate (i.e., chip 604). SPADs 602-1 and 602-2 are separated from one another on chip 604 by sufficient space to ensure that they are substantially isolated from one another, electrically and optically. Since they are fabricated in the same local region of the chip, however, they have substantially identical operational characteristics.

Resistor R7 electrically couples the anodes of SPADS 602-1 and 602-2. Resistor R7 is a conventional resistor having suitable resistivity. It will be clear to one skilled in the art how to specify, make, and use resistor R7.

At operation 702, SPAD 602-1 is optically coupled with input optical signal 606—typically via an optical fiber. In some embodiments, SPAD 602-2 is physically adapted to block light from reaching its active region, such as by including a light-blocking layer that optically isolates the SPAD from input optical signal 606.

At operation 703, $V_{bias}1$ and $V_{bias}2$ are provided to SPADs 602-1 and 602-2, respectively.

At operation 704, gating signal 608 provided to each of SPADs 602-1 and 602-2.

Gating signal 608 is a square wave signal having a frequency, for example, within the range of 100 MHz to 10 GHz. One skilled in the art will recognize that gating signal 606 can have any suitable frequency.

Splitter 610 is a conventional 50:50 signal splitter that splits gating signal 608 equally between SPADs 602-1 and 602-2. As a result, each of the SPADs is gated with a substantially identical gating signal.

Gating signal 608 has an amplitude such that, in combination with DC bias voltages $V_{bias}1$ and $V_{bias}2$, provides SPADs 602-1 and 602-2 with a bias voltage that is above the breakdown voltage, $V_{br}$, of each SPAD for approximately half of the time (i.e., having a duty factor of approximately 50%). In some embodiments, gating signal 608 and DC bias voltages $V_{bias}1$ and $V_{bias}2$, collectively bias SPADs 602-1 and 602-2 with a bias voltage having a duty factor anywhere within the range of approximately 10% to approximately 90%.

At operation 705, output signals 612 and 614 are provided by SPADs 602-1 and 602-2, respectively.

At operation 706, output signal 612 is inverted at inverter 616.

At operation 707, inverted output signal 612 and non-inverted output signal 614 collectively provide voltage drop VL across load resistor RL. Voltage drop VL is provided as output signal 618 at output terminal 620.

In some embodiments, output signal 614 is inverted and added to non-inverted output signal 612 to form output signal 618. In some embodiments, splitter 610 and/or inverter 616 are included in the same package that contains chip 604. In some embodiments, chip 604, resistor R7, splitter 610, and inverter 616 are monolithically integrated. In some embodiments, the subtraction of the output signals from SPADs 602-1 and 602-2 occurs off chip using external circuitry.

When no avalanche is present in either of SPADs 602-1 and 602-2, output signal 618 is substantially constant because capacitive transients that arise due to gating signal 608 are effectively canceled. As a result, a pulse that arises on output signal 612 when an avalanche occurs at SPAD 602-1 can be easily detected on output signal 618.

Figure 8:
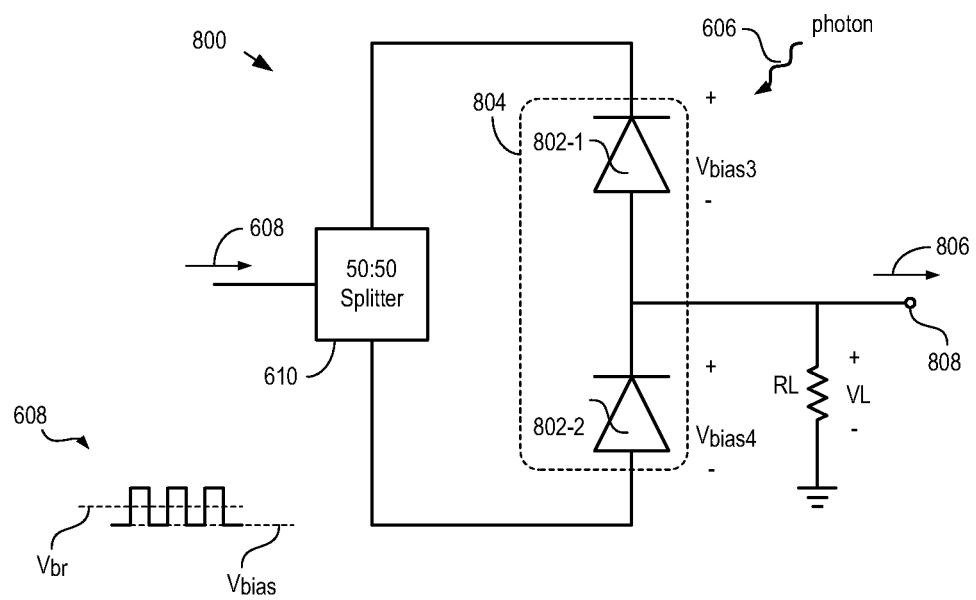
FIG. 8 depicts a schematic drawing of a single-photon receiver in accordance with an alternative embodiment of the present invention.

FIG. 8 depicts a schematic drawing of a single-photon receiver in accordance with an alternative embodiment of the present invention. Receiver 800 comprises SPADs 802-1 and 802-2, splitter 610, and output terminal 808. Receiver 800 is an example of embodiments of the present invention wherein the effective gating of two SPADs is inverted with respect to each other, which enables the outputs of the two SPADs to be directly summed to cancel substantially all transients in their respective outputs.

Figure 9:
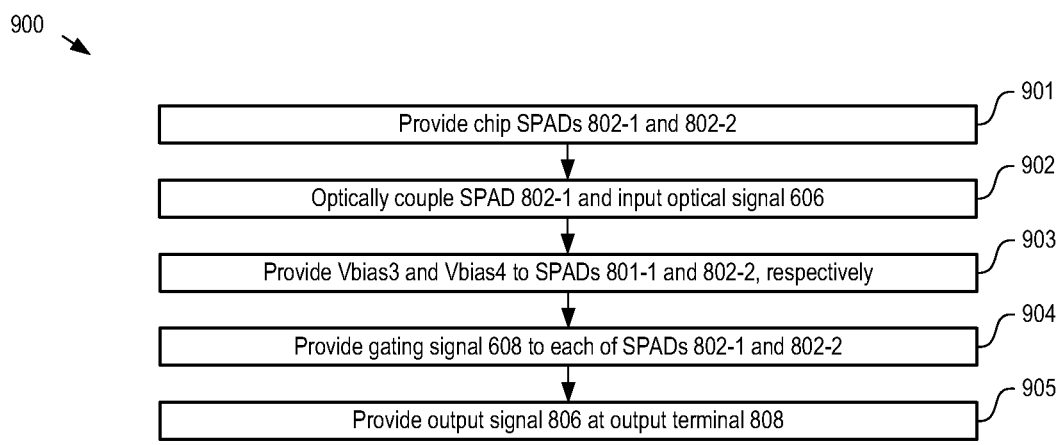
FIG. 9 depicts operations of a method suitable for operation of a single-photon receiver in accordance with the illustrative embodiment of the present invention.

FIG. 9 depicts operations of a method suitable for operation of a single-photon receiver in accordance with the illustrative embodiment of the present invention. Method 900 begins with operation 901, wherein SPADS 802-1 and 802-2 are provided as part of packaged chip 804. Typically, chip 804 is included in a conventional package that typically also includes a thermoelectric cooler.

SPADs 802-1 and 802-2 are analogous to SPADs 602-1 and 602-2; however, in contrast to the anode-to-anode configuration of SPADs 602-1 and 602-2 receiver 600, SPADs 802-1 and 802-2 are directly electrically connected anode-to-cathode. This configuration is more conventional for balanced detectors in balanced receivers used in traditional coherent detection approaches to optical communications.

At operation 902, SPAD 802-1 is optically coupled with input optical signal 606—typically via an optical fiber.

At operation 903, $V_{bias}3$ and $V_{bias}4$ are provided to SPADs 802-1 and 802-2, respectively.

At operation 904, gating signal 608 provided to each of SPADs 802-1 and 802-2 via splitter 610. $V_{bias}3$ and $V_{bias}4$ are substantially identical and approximately equal to the breakdown voltage of each of the SPADs. By virtue of their opposite orientation with respect to the application of gating signal 608, the effective gating of each of SPADs 802-1 and 802-2 is inverted with respect to the other. In other words, when one of the SPADs is biased above its breakdown voltage (i.e., armed), the other SPAD is biased below its breakdown voltage (i.e., quenched).

At operation 905, the outputs of SPADs 802-1 and 802-2 are directly summed and develop voltage drop VL across load resistor RL. Voltage drop VL is provided as output signal 806 at output terminal 808. As a result of the fact that the effective biasing of SPADs 802-1 and 802-2 is inverted with respect to one another, transients attributable to gating signal 608 in the outputs of SPADs 802-1 and 802-2 are substantially completely canceled in output signal 806. An avalanche event due to the incidence of a photon on SPAD 802-1 is easily detected, therefore, without interference from capacitive transients.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A single-photon receiver comprising:
    a first single-photon avalanche diode (SPAD) that is operative for providing a first output signal;
    a second SPAD that is operative for providing a second output signal, the first SPAD and second SPAD being monolithically integrated;
    a splitter that is dimensioned and arranged to provide a first gating signal to each of the first SPAD and second SPAD; and
    an output terminal, the output terminal being operative for providing a third output signal that is based on the first output signal and the second output signal.

2. The receiver of claim 1, wherein the third output signal is based on a difference between the first output signal and the second output signal.

3. The receiver of claim 1, wherein the third output signal is based on a direct summation of the first output signal and the second output signal.

4. The receiver of claim 3, wherein the first SPAD, second SPAD, and splitter are arranged such that the effective gating of the first SPAD and the effective gating of the second SPAD are inverted with respect to one another.

5. The receiver of claim 1 further comprising an inverter that is operative for inverting one of the first output signal and second output signal.

6. The receiver of claim 1 wherein the first SPAD and second SPAD are configured in an anode-to-cathode arrangement.

7. The receiver of claim 1, wherein the first SPAD has a first anode and the second SPAD has a second anode, and wherein the first SPAD and second SPAD are configured in an anode-to-anode arrangement.

8. The receiver of claim 7 further comprising a resistor, the resistor being electrically connected between the first anode and the second anode.

9. The receiver of claim 1 wherein the second SPAD is physically adapted to inhibit its detection of a light signal.

10. A single-photon receiver comprising:
    a first substrate;
    a first single-photon avalanche diode (SPAD) that is monolithically integrated with the first substrate, the first SPAD including a first terminal and a second terminal;
    a second SPAD that is monolithically integrated with the first substrate, the second SPAD including a third terminal and a fourth terminal;
    a splitter that is dimensioned and arranged to provide a first gating signal to each of the first terminal and the third terminal; and
    an output terminal, the output terminal being electrically coupled with each of the second terminal and fourth terminal.

11. The receiver of claim 10, wherein the output terminal is electrically connected with each of the second terminal and fourth terminal.

12. The receiver of claim 10, further comprising an inverter having a fifth terminal and a sixth terminal, the fifth terminal being electrically connected with the second terminal, and the sixth terminal being electrically connected with the output terminal and the fourth terminal.

13. The receiver of claim 10, further comprising a resistor having a fifth terminal and a sixth terminal, the fifth terminal being electrically connected with the second terminal, and the sixth terminal being electrically connected with the fourth terminal.

14. The receiver of claim 10, wherein the first SPAD has a first anode and a first cathode, and wherein the second SPAD has a second anode and a second cathode, and further wherein the first terminal is electrically connected with the first cathode, the second terminal is electrically connected with the first anode, the third terminal is electrically connected with the second cathode, and the fourth terminal is electrically connected with the second anode.

15. The receiver of claim 10, wherein the first terminal is electrically connected with a first cathode, the second terminal is electrically connected with a first anode, the third terminal is electrically connected with a second anode, and the fourth terminal is electrically connected with a second cathode.

16. A method for detecting a single photon, the method comprising:
    providing a first gating signal to each of a first single-photon avalanche diode (SPAD) and a second SPAD, the first SPAD and second SPAD being monolithically integrated, wherein the first SPAD provides a first output signal and the second SPAD provides a second output signal;
    optically coupling the first SPAD with an input optical signal; and
    providing a third output signal that is based on the first output signal and the second output signal.

17. The method of claim 16, further comprising:
    inverting the first output signal; and
    combining the inverted first output signal and the second output signal to provide the third output signal.

18. The method of claim 16, further comprising:
    inverting the second output signal; and
    combining the inverted second output signal and the first output signal to provide the third output signal.

19. The method of claim 16, wherein the first SPAD has a first anode and a first cathode, and wherein the second SPAD has a second anode and a second cathode, and further wherein the first SPAD and second SPAD are provided such that the first cathode and the second cathode are electrically coupled via a resistor.

20. The method of claim 16, wherein the first SPAD has a first anode and a first cathode, and wherein the second SPAD has a second anode and a second cathode, and further wherein the first SPAD and second SPAD are provided such that the first anode and the second cathode are electrically connected.

21. The method of claim 16, wherein the effective gating of one of the first SPAD and second SPAD is inverted with respect to the effective gating of the other one of the first SPAD and second SPAD.

* * * * *